(12) United States Patent
Hwang et al.

(10) Patent No.: US 11,602,821 B2
(45) Date of Patent: Mar. 14, 2023

(54) WAFER POLISHING HEAD, SYSTEM THEREOF, AND METHOD USING THE SAME

(71) Applicant: TAIWAN SEMICONDUCTOR MANUFACTURING COMPANY LTD., Hsinchu (TW)

(72) Inventors: James Jeng-Jyi Hwang, Hsin-Chu County (TW); He Hui Peng, Changhua County (TW); Jiann Lih Wu, Hsin-Chu (TW); Chi-Ming Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 477 days.

(21) Appl. No.: 16/746,058

(22) Filed: Jan. 17, 2020

(65) Prior Publication Data

US 2021/0220965 A1 Jul. 22, 2021

(51) Int. Cl.
*B24B 47/12* (2006.01)
*H01L 21/304* (2006.01)
*B24B 57/02* (2006.01)
*B24B 37/20* (2012.01)

(52) U.S. Cl.
CPC .............. *B24B 47/12* (2013.01); *B24B 37/20* (2013.01); *B24B 57/02* (2013.01); *H01L 21/304* (2013.01)

(58) Field of Classification Search
CPC ......... B24B 47/12; B24B 37/20; B24B 57/02; H01L 21/304
USPC ..................... 451/359, 41, 60, 495
See application file for complete search history.

(56) References Cited

U.S. PATENT DOCUMENTS

| | | | |
|---|---|---|---|
| 6,863,771 B2* | 3/2005 | Brown | B24B 1/005 451/41 |
| 9,962,805 B2* | 5/2018 | Chang | B24B 37/005 |
| 2007/0167110 A1* | 7/2007 | Tseng | B24B 37/30 451/5 |
| 2015/0111477 A1* | 4/2015 | Suen | B24B 37/30 451/60 |
| 2020/0094370 A1* | 3/2020 | Cherian | G06N 3/084 |

* cited by examiner

*Primary Examiner* — Joseph J Hail
*Assistant Examiner* — Shantese L McDonald
(74) *Attorney, Agent, or Firm* — WPAT Law; Anthony King

(57) ABSTRACT

A wafer polishing head is provided. The wafer polishing head includes a carrier head, a plurality of piezoelectric actuators disposed on the carrier head, and a membrane disposed over the plurality of piezoelectric actuators. The plurality of piezoelectric actuators is configured to provide mechanical forces on the membrane and generate an electrical charge when receiving counterforces of the mechanical forces through the membrane. A wafer polishing system and a method for polishing a substrate using the same are also provided.

20 Claims, 16 Drawing Sheets

WAFER POLISHING HEAD, SYSTEM THEREOF, AND METHOD USING THE SAME

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, developments in IC processing and manufacturing systems and apparatuses are needed.

CMP (Chemical Mechanical Polishing) is a process of smoothing surfaces with a combination of chemical and mechanical forces. The process uses abrasives and corrosive chemical slurry (sometimes referred to as a colloid), and can be thought of as a hybrid of chemical etching and free abrasive polishing. In the CMP process, a wafer is pressed and rotated against a polishing pad. This removes material and tends to even out any irregular topography, making the wafer flat or planar. This may be necessary to prepare the wafer for the formation of additional circuit elements, and a polished wafer with a good polish profile is critical to the manufacturing process, especially for devices of advanced generations.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
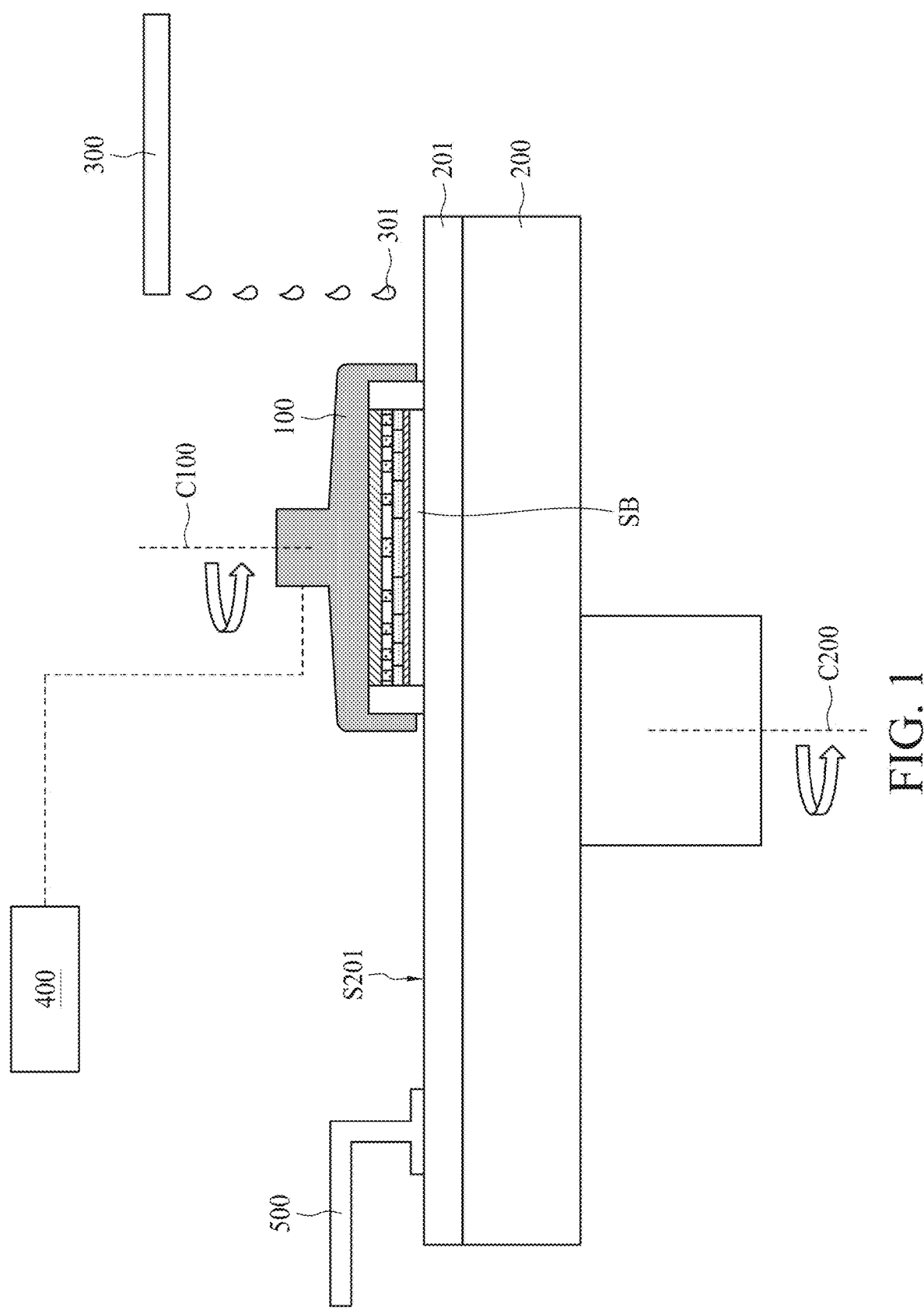
FIG. 1 is a schematic diagram of a CMP system according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In general, the design of polishing heads of current chemical-mechanical polishing (CMP) systems allows control of the polish uniformity. The current method of polish uniformity control utilizes deformation of a membrane by a pneumatic mechanism. Different air pressures are supplied to different cells of the membrane, and several air cells with different pressures in the membrane are provided to exert downward force on a wafer for polish control. However, the air cells are all adjacent, and interference between neighboring air cells occurs, affecting the polish uniformity control of the polishing head. For instance, a first pressure is provided to a first air cell of the membrane, and a second pressure is provided to a second air cell of the membrane, which is directly adjacent to the first air cell. The first pressure is greater than the second pressure, and because the diaphragm separating the first air cell and the second air cell is soft and flexible, being the same material as the membrane, the second air cell also receives some pressure from the first air cell. As a result, the second air cell has an altered air pressure that is actually greater than the original or target second pressure provided into the second air cell, and the first air cell actually has an altered air pressure less than the original or target first pressure provided into the first air cell. Therefore, the pressures provided to different regions of the wafer are different from the target pressures, and the polish uniformity of the polishing head is not effectively controlled.

The present disclosure provides a polishing head including several piezoelectric actuators for controlling the pressures applied to different regions of the wafer. The method of polish profile control of the present disclosure utilizes a piezoelectric mechanism instead of a pneumatic mechanism to solve the air pressure interference issues illustrated above. The present disclosure also provides a system including the polishing head and a method for polishing a substrate using the polishing head. In addition, elements, conditions or parameters illustrated in different embodiments can be combined or modified to form different combinations of embodiments as long as the elements, parameters or conditions used are not conflicted. For ease of illustration, reference numerals with similar or same functions and properties are repeatedly used in different embodiments and figures.

FIG. 1 is a schematic diagram of a CMP system 10 according to some embodiments of the present disclosure. As shown in FIG. 1, the CMP system 10 includes a polishing head 100 and a platen 200. The polishing head 100 is configured to hold a substrate SB targeted to a CMP operation. The platen 200 is configured to allow a polishing pad 201 to be disposed thereon. When the CMP system 10 is in use, the polishing pad 201 is disposed on the platen 200, and the substrate SB is held by the polishing head 100 against the polishing pad 201. In some embodiments, the substrate SB is a wafer or a semiconductor substrate. In some embodiments, the polishing head 100 is rotated along a central line C100 (indicated with a dashed line) of the polishing head 100, and thus the substrate SB is also rotated against the polishing pad 201 during the CMP operation. In some embodiments, the central line C100 passes through a center of the substrate SB so that the center of the substrate SB is also a center of rotation of the substrate SB in the CMP operation. Details of the polishing head 100 are illustrated in the following description along with FIG. 2.

In some embodiments, the CMP system 10 includes a slurry delivery unit 300 and a control unit 400. The slurry delivery unit 300 is disposed over the platen 200, and supplies and deposits slurry 301 on the polishing pad 201 when the CMP operation is performed. The cooperation between the slurry 301 and the polishing pad 201 removes material on the substrate SB and tends to even out any irregular topography, making the substrate SB flat or planar. In some embodiments, the platen 200 is rotated along a central line C200 (indicated with a dashed line), and thus the polishing pad 201 is also rotated when the CMP system 10 is in use. The control unit 400 is electrically connected to the polishing head 100 and configured to send or receive one or more signals to or from the polishing head 100 in order to adjust a polish profile of the polishing head 100.

In some embodiments, the CMP system 10 also includes a pad dresser 500. The pad dresser 500 is disposed over the platen 200 and the polishing pad 201, and faces the polishing pad 201. During the CMP operation, the pad dresser 500 pushes on the polishing pad 201 with a downward force that brings the pad dresser 500 into contact with the polishing pad 201. As the polishing pad 201 is rotated by the platen 200 during the CMP operation, the pad dresser 500 roughens a polish surface S201 of the polishing pad 201 to provide mechanical mechanism of the polishing pad 201 on the substrate SB.

Figure 2:
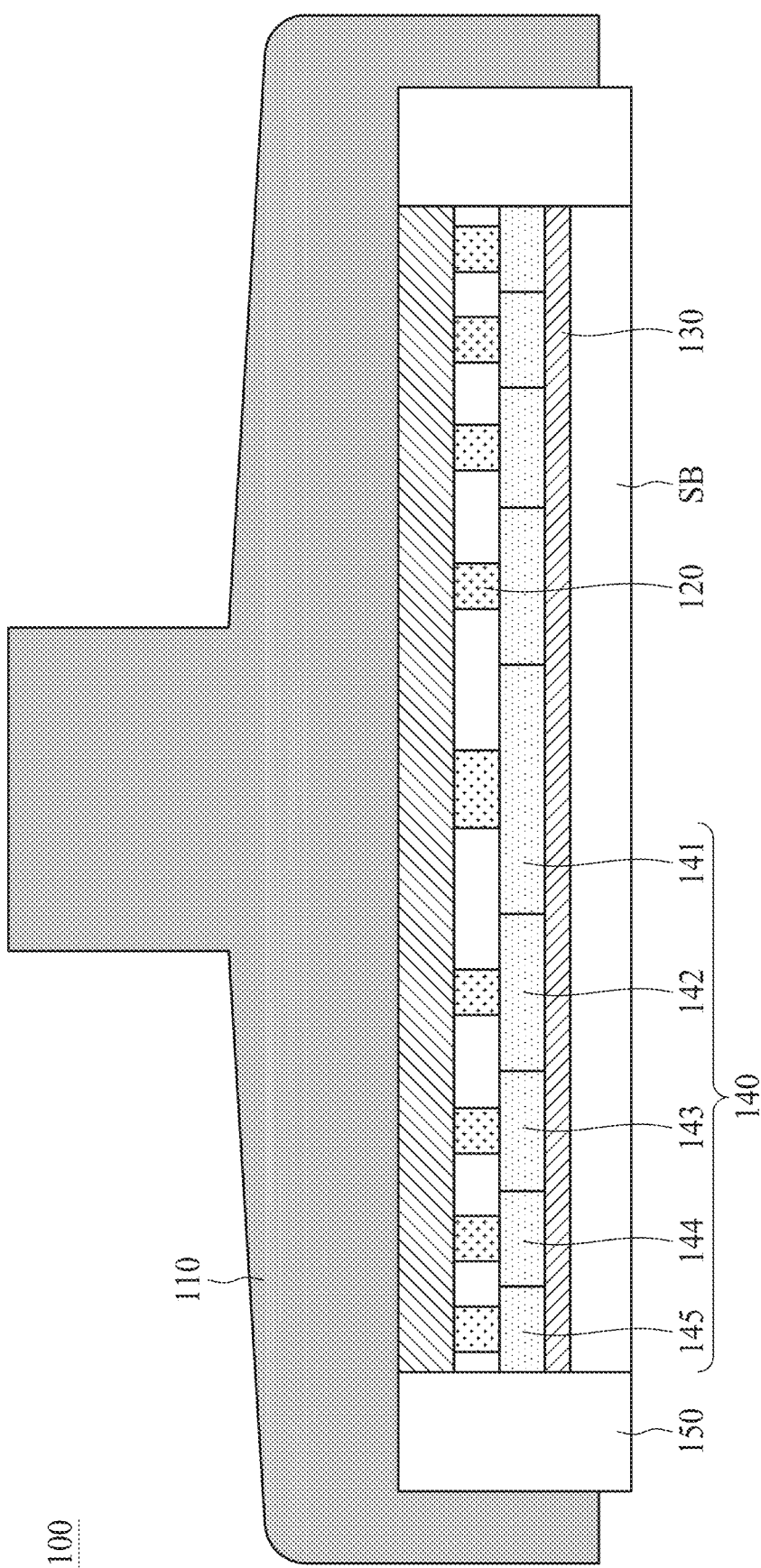
FIG. 2 is a schematic diagram of a polishing head holding a substrate according to some embodiments of the present disclosure.

FIG. 2 is a schematic diagram of the polishing head 100 holding the substrate SB according to some embodiments of the present disclosure. The polishing head 100 includes a carrier head 110, a plurality of piezoelectric actuators 120, and a membrane 130. The carrier head 110 is a main body of the polishing head 100 and is configured to house other elements and circuits of the polishing head 100. The plurality of piezoelectric actuators 120 is disposed on the carrier head 110, and the membrane 130 is disposed on the carrier head 110 and the plurality of piezoelectric actuators 120. The plurality of piezoelectric actuators 120 are configured to provide mechanical forces on the substrate SB through the membrane 130, and generate an electrical charge when receiving counterforces of the mechanical forces from the substrate SB through the membrane 130. The mechanical forces from the piezoelectric actuators 120 are provided downward, pushing the substrate SB against the polishing pad 201. The membrane 130 is disposed between the piezoelectric actuators 120 and the substrate SB. The membrane 130 is a monolithic structure and is made of soft and flexible material to prevent damage and contamination of the polishing head 100 from chemicals and abrasives of the slurry 301. In some embodiments, the membrane 130 functions as a blocking film, preventing chemicals and abrasives of the slurry 301 from leaking into the polishing head 100.

In some embodiments, the polishing head 100 further includes a retaining ring 150, disposed on the carrier head 110 and surrounding the substrate SB and the membrane 130. The retaining ring 150 is configured to hold the substrate SB during the CMP operation. In some embodiments, the retaining ring 150 also surrounds the plurality of piezoelectric actuators 120. In some embodiments, the retaining ring 150 has a ring shape. In some embodiments, the retaining ring 150 is in contact with the polishing pad 201 during the performing of the CMP operation. As shown in FIG. 2, the retaining ring 150 and a polish surface of the substrate SB can be aligned. In some embodiments, the retaining ring 150 is separated from the polishing pad 201 during the CMP operation as long as the substrate SB can be held by the retaining ring 150.

In some embodiments, each of the plurality of piezoelectric actuators 120 has a cylindrical shape, and the piezoelectric actuators 120 are dispersed evenly or unevenly over the substrate SB, without completely overlapping the substrate SB. In some embodiments, as shown in FIG. 2, the polishing head 100 further comprises a plurality of plates 140, disposed between the membrane 130 and the plurality of piezoelectric actuators 120, wherein the plurality of plates 140 are configured to equalize the mechanical forces from the piezoelectric actuators 120 to the substrate SB. The plurality of plates 140 can be made of same or different materials. The materials are selected from durable materials that can withstand mechanical loads and have high hardness and strength, and the materials of the plates are not limited herein. In some embodiments, the plurality of plates 140 collectively are substantially the same size and shape as the substrate SB and the membrane 130. A number of plates of the plurality of plates 140 can be adjusted according to different embodiments. In the embodiments shown in FIG. 2, the plurality of plates 140 includes plates 141, 142, 143, 144 and 145 for the purpose of illustration. Size and shape of each of the plurality of plates 140 are not limited herein. In the following description, different sizes and shapes of the plurality of plates 140 according to different embodiments of the present disclosure are provided for the purpose of illustration.

Figure 3:
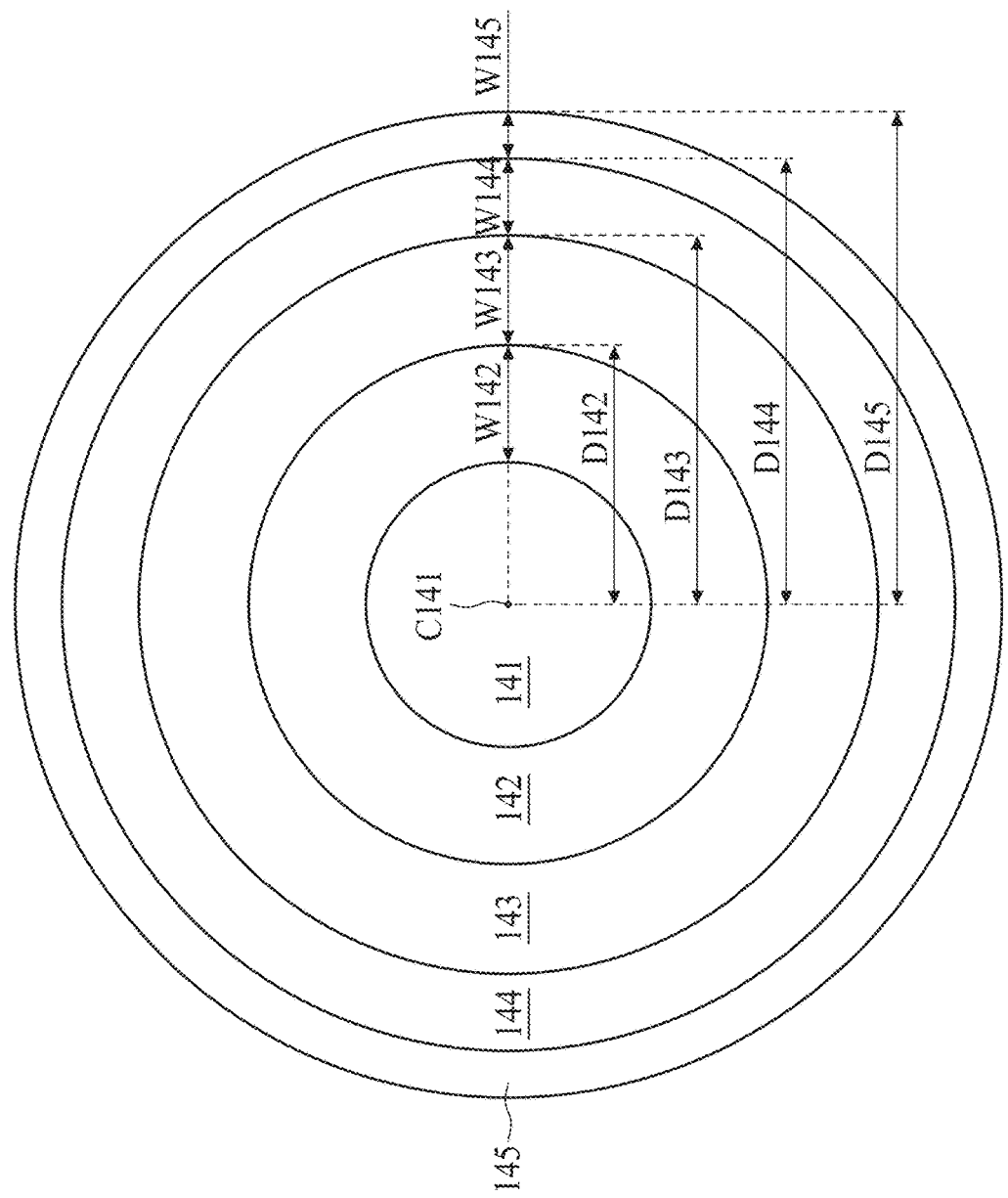
FIG. 3 is a top view perspective of a plurality of plates in accordance with some embodiments of the present disclosure.

FIG. 3 is a top view perspective of the plurality of plates 140 in accordance with some embodiments of the present disclosure. The plate 141 of the plurality of plates 140 has a circular shape, and each of the plates 142, 143, 144 and 145 has a ring shape from the top view perspective. In some embodiments, a center C141 of the plate 141 is a center of rotation of the plurality of plates 140. In some embodiments, the central line C100 of the polishing head 100 passes through the center C141 of the plate 141. In some embodiments, the center C141 is coincident with a center of the membrane 130, and/or is coincident with a center of the substrate SB. The plates 142, 143, 144 and 145 individually surround the plate 141 and are sequentially disposed outward from the plate 141. As control of the polish profile at the edge of the substrate SB is more difficult to attain than control of the polish profile at the central region of the substrate SB, a width of a ring-shaped plate (a distance between outer edges of adjacent plates measured along an axis passing through the center C141) decreases as a diameter of the plate (a distance between an outer edge of the plate to the center C141, measured along the axis passing through the center C141) increases. In other words, as shown in FIG. 3, widths W142, W143, W144 and W145 of the plates 142, 143, 144 and 145 gradually decrease as distances from the center C141 (or diameters D142, D143, D144, and D145 of the plates 142, 143, 144 and 145) increase. The width W142 of the plate 142 is greater than the width W143 of the plate 143, the width W143 is greater than the width W144 of the plate 144, and the width W144 is greater than the width W145 of the plate 145. The diameter D145 is greater than the diameter D144, the diameter D144 is greater than the diameter D143, and the diameter D143 is greater than the diameter D142.

Moreover, the plates 141, 142, 143, 144 and 145 are separated from each other, and a distance between the adjacent plates is not limited herein. The distance can be adjusted depending on materials, thicknesses, and speed of rotation of the plates, as long as frictions generated during the CMP operation between the adjacent plates are not enough to influence a polish profile of the substrate SB, or gaps between the adjacent plates are not enough to influence the polish profile of the substrate SB.

Figure 4:
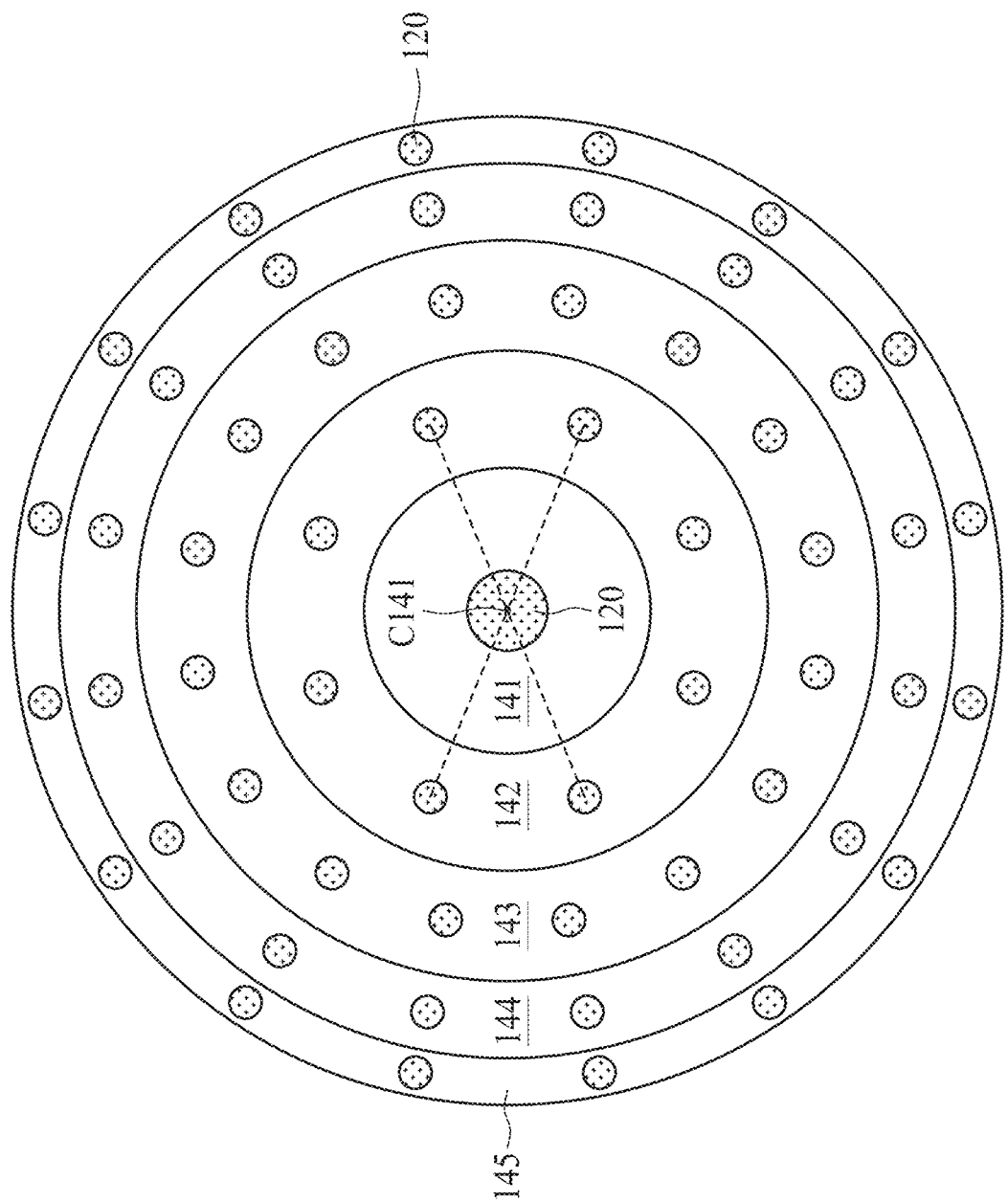
FIG. 4 is a top view perspective of a plurality of plates and a plurality of piezoelectric actuators in accordance with some embodiments of the present disclosure.

FIG. 4 is a top view perspective of the plurality of piezoelectric actuators 120 on the plurality of plates 140 shown in FIG. 3 in accordance with some embodiments of the present disclosure. In the embodiments shown in FIG. 4, each of the plates 141, 142, 143, 144 and 145 is a monolithic structure, and in order to have a good control of a polish profile of the polishing head 100, each of the plates 141, 142, 143, 144 and 145 is connected to (or in contact with) one or more piezoelectric actuators 120. In some embodiments, the plate 141 is connected to (or in contact with) one piezoelectric actuator 120 at the center C141. In some embodiments, the plurality of piezoelectric actuators 120 is grouped into a plurality of groups, wherein the piezoelectric actuators 120 in one group are all connected to (or in contact with) a single plate 141, 142, 143, 144 or 145. As shown in FIG. 3, different groups of the plurality of piezoelectric actuators 120 are respectively connected (or in contact with) the different plates 141, 142, 143, 144 and 145. In some embodiments, the piezoelectric actuators 120 in the same group (or overlapping the same plate 142, 143, 144 or 145) have substantially same distances to the center of rotation of the plurality of plates 140, i.e., the center C141. As mentioned above, the center C141 is coincident with a center of the membrane 130, and/or is coincident with a center of the substrate SB. That is, in some embodiments, the piezoelectric actuators 120 in the same group (or overlapping the same plate 142, 143, 144 or 145) have substantially same distances to the center of the membrane 130 or the center of the substrate SB.

For a purpose of good control of the polish profile of the polishing head 100 toward the edge portion, an arrangement of the piezoelectric actuators 120 from the center of the substrate SB toward the edge portion of the substrate SB is important. In some embodiments, a number of the piezoelectric actuators 120 in the same group increases toward the edge portion of the polishing head 100. In the embodiments shown in FIG. 4, the plate 141 is connected to only one piezoelectric actuator 120, the plate 142 is connected to 8 piezoelectric actuators 120, and each of the plates 143, 144 and 145 is connected to 16 piezoelectric actuators 120. In some embodiments as illustrated in FIG. 3 and above paragraphs, the widths W142, W143, W144 and W145 of the plates 142, 143, 144 and 145 gradually decrease as distances from the center C141 (or diameters D142, D143, D144, and D145 of the plates 142, 143, 144 and 145) increase. Therefore, even each of the plates 143, 144 and 145 are connected to a same number of piezoelectric actuators 120, a good control of the polish uniformity of the substrate S toward the edge portion can be provided since the widths W143, W144 and W145 decrease toward the edge portion.

In some embodiments, the piezoelectric actuators 120 in a single group are evenly arranged on the plate 142, 143, 144 or 145 they are connected to. FIG. 4 shows an arrangement of the plurality of piezoelectric actuators 120 on the plurality of plates 140 from a top view perspective in accordance with some embodiments of the present disclosure. As shown in FIG. 4, the piezoelectric actuators 120 disposed over the plate 142 are evenly distributed on the plate 142, and are symmetrically arranged with respect to the center of rotation (i.e., the center C141 in some embodiments). In some embodiments, the piezoelectric actuators 120 in a single group are arranged symmetric with respect to the center C141, but the disclosure is not limited thereto. In some embodiments, the piezoelectric actuators 120 in a single group are arranged along at least one circumferential line relative to the center C141 or the central line C100. That is, at least two of the piezoelectric actuators 120 are located on the same circumferential line relative to the center C141. Therefore, the uniformity control of the polishing head 100 can be carried out along at least one circumferential line relative to the center C141. In some embodiments, for a purpose of good control of the polish uniformity, the piezoelectric actuators 120 in a single group are connected to a same voltage, and thus the piezoelectric actuators 120 in the same group can generate substantially same mechanical forces on the substrate SB against the polishing pad 201. A similar arrangement can be applied to the piezoelectric actuators 120 on the plates 143, 144 and 145.

Sizes or shapes of the piezoelectric actuators 120 can be different. In some embodiments, as shown in FIG. 4, the piezoelectric actuator 120 connected to the plate 141 is larger than the piezoelectric actuators 120 connected to other plates 142, 143, 144 and 145. In some embodiments, a shape of the piezoelectric actuator 120 from the top view perspective can be other than a circle, and is not limited herein. In addition, a number of the piezoelectric actuators 120 on each of the plurality of plates 140 is not limited herein. In the embodiments shown in FIG. 4, only one piezoelectric actuator 120 is connected to the plate 141 since one piezoelectric actuator 120 is enough to control the respective region of the substrate SB disposed underlying the plate 141. In some embodiments, multiple piezoelectric actuators 120 are connected to the plate 141.

Figure 5:
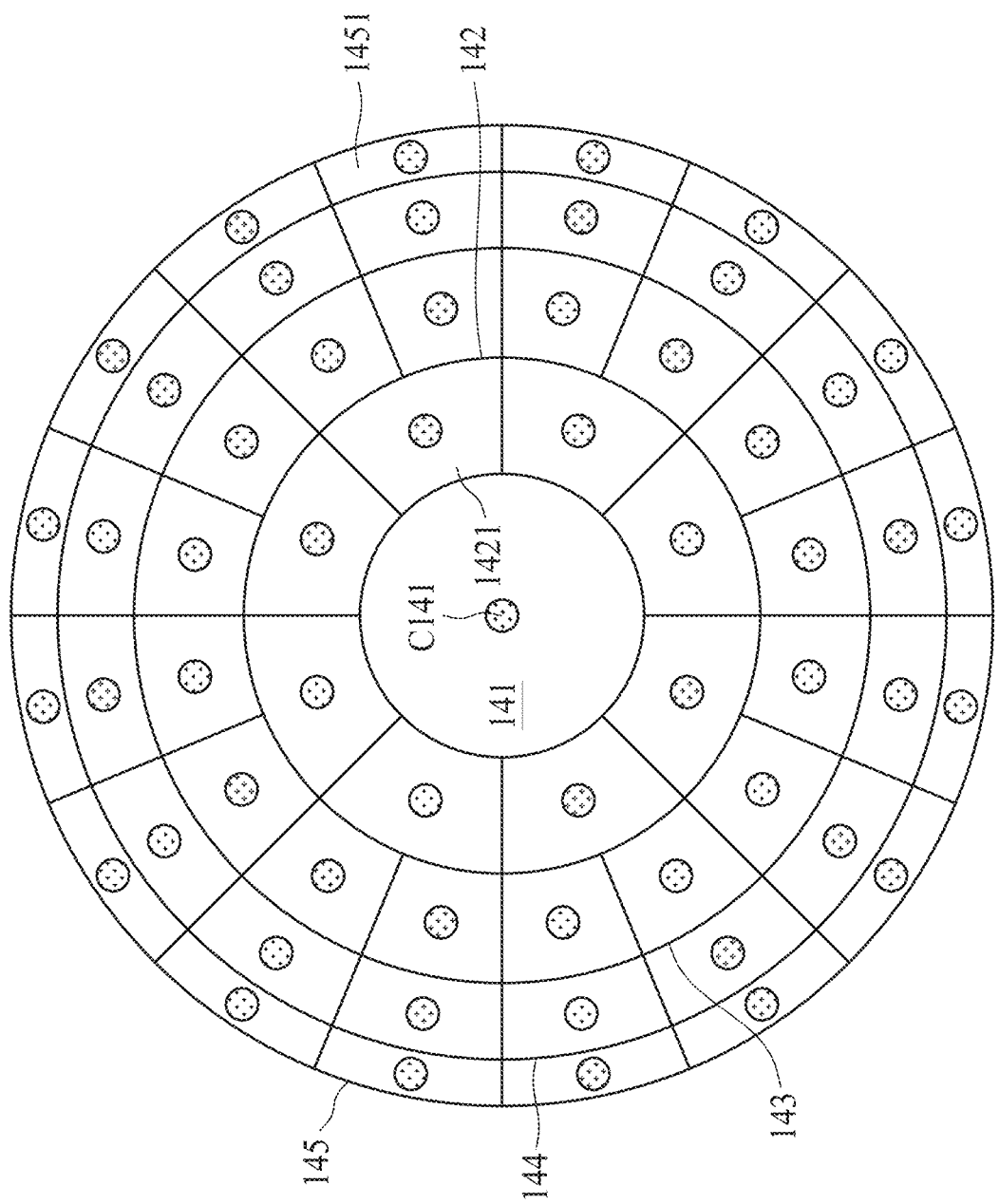
FIG. 5 is a top view perspective of a plurality of plates and a plurality of piezoelectric actuators in accordance with some embodiments of the present disclosure.
Figure 6:
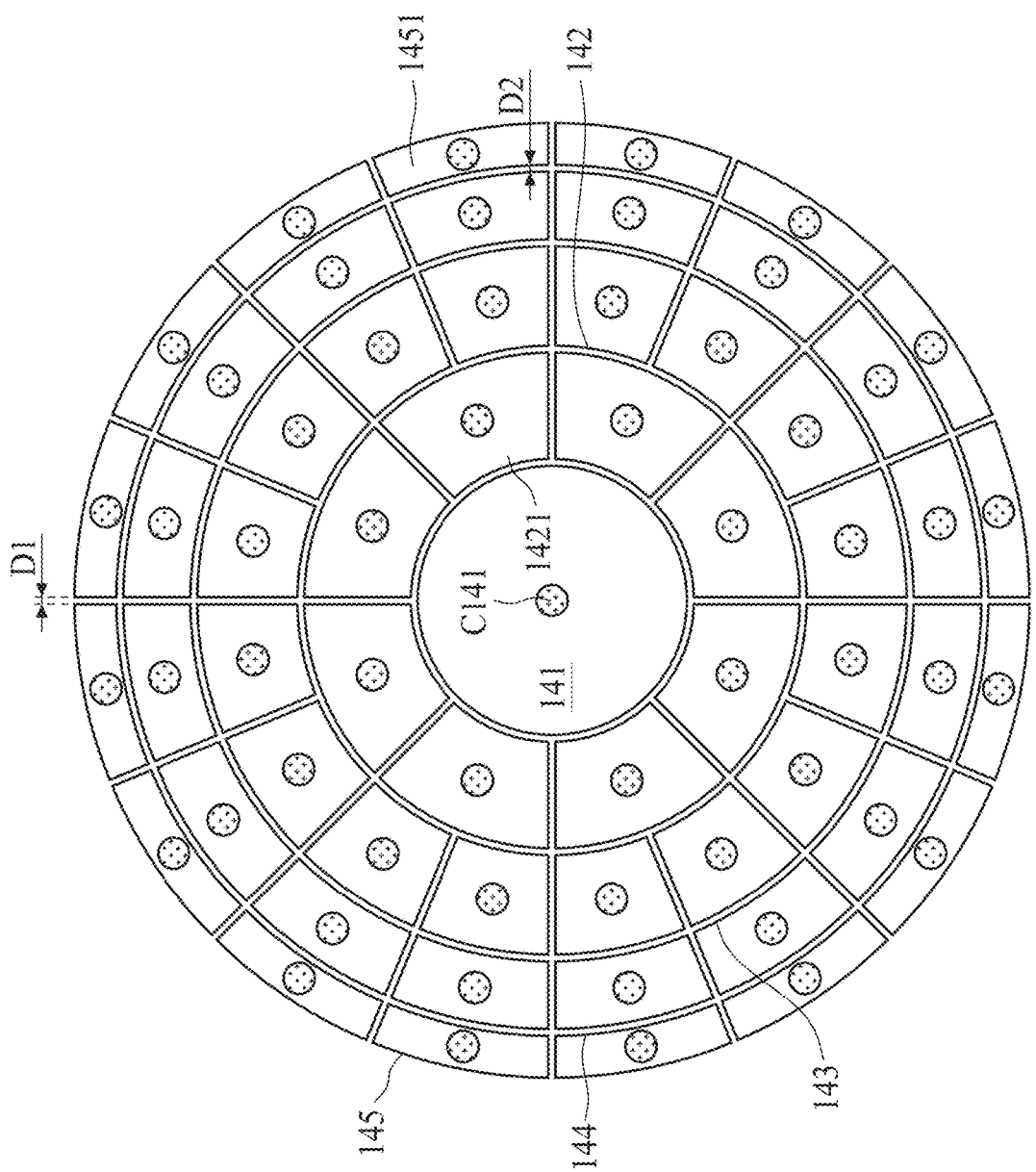
FIG. 6 is a top view perspective of a plurality of plates and a plurality of piezoelectric actuators in accordance with some embodiments of the present disclosure.
Figure 7:
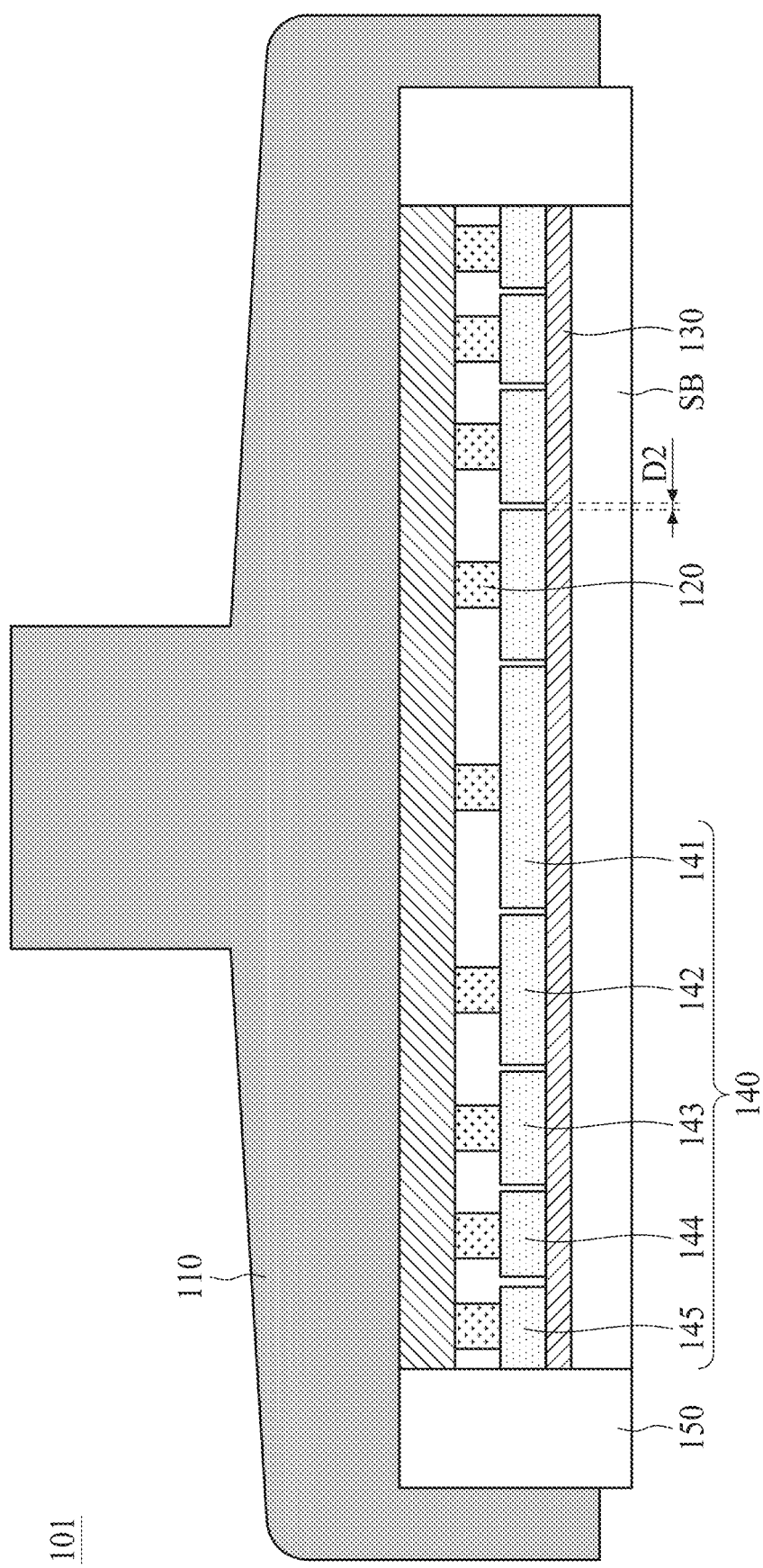
FIG. 7 is a schematic diagram of a polishing head holding a substrate according to some embodiments of the present disclosure.

FIG. 5 shows arrangements of the plurality of plates 140 and the piezoelectric actuators 120 in accordance with some embodiments of the present disclosure. The embodiment shown in FIG. 5 is similar to the embodiment shown in FIG. 4. A difference between the embodiments of FIGS. 4 and 5 is that each of the plates 142, 143, 144 and 145 are divided into several sectors in the embodiment shown in FIG. 5 (i.e., the plates 142, 143, 144 and 145 are not monolithic, but rather integrated structures). The sectors in a single plate 142, 143, 144 or 145 are adjacent to one another and are arranged to form the ring shape of the respective plate 142, 143, 144 or 145. In some embodiments, each of the sectors is connected to (or in contact with) one of the piezoelectric actuators 120. In some embodiments, the sectors are physically separated as shown in FIG. 6. FIG. 7 is a schematic diagram of a polishing head 101, wherein the polishing head 101 is similar to the polishing head 100 but includes the plurality of plates 140 as shown in FIG. 6 according to some embodiments of the present disclosure. As a gap between two adjacent sectors being too large, a control of polish profile can be more difficult and the polish uniformity of the substrate SB can decrease. Thus, in some embodiments, a distance D1 between two adjacent sectors in the same group is greater than zero and less than 0.02 millimeters (mm). Similarly, the plates 142, 143, 144 and 145 can also be physically separated or in contact with each other depends on different applications as shown in FIGS. 4 to 6. In some embodiments, a distance D2 between two adjacent plates can be in a range of zero and 0.02 millimeters (mm).

As illustrated in FIGS. 5 and 6, the plate farther away from the center C141 is divided into more sectors for a purpose of better control of the polish uniformity of the substrate SB. In some embodiments, the plates 142, 143, 144 and 145 are divided along circumferential lines relative to the center C141. For a purpose of illustration, the plate 142 is evenly divided into 8 sectors 1421, and the plate 145 is evenly divided into 16 sectors 1451 as shown in FIG. 5. The piezoelectric actuators 120 in one plate have substantially the same distance to the center C141. In some embodiments, for a purpose of better control of the polish uniformity in different regions of the substrate SB with respective to each of the sectors, the piezoelectric actuators 120 are disposed at geographic centers of the respective sectors.

A benefit of aligning one sector to one piezoelectric actuator 120 is that every respective region of the substrate SB can be controlled individually. However, the present disclosure is not limited thereto. In some embodiments, each sector is connected to multiple piezoelectric actuators 120. In such embodiments, the multiple piezoelectric actuators 120 connected to the same plate are evenly distributed on the plate. A number of piezoelectric actuators 120 connected one sector or one plate is not limited herein.

In order to further illustrate advantages of the present disclosure, in the following description, a method M10 for polishing the substrate SB using the CMP system 10 is provided.

Figure 8:
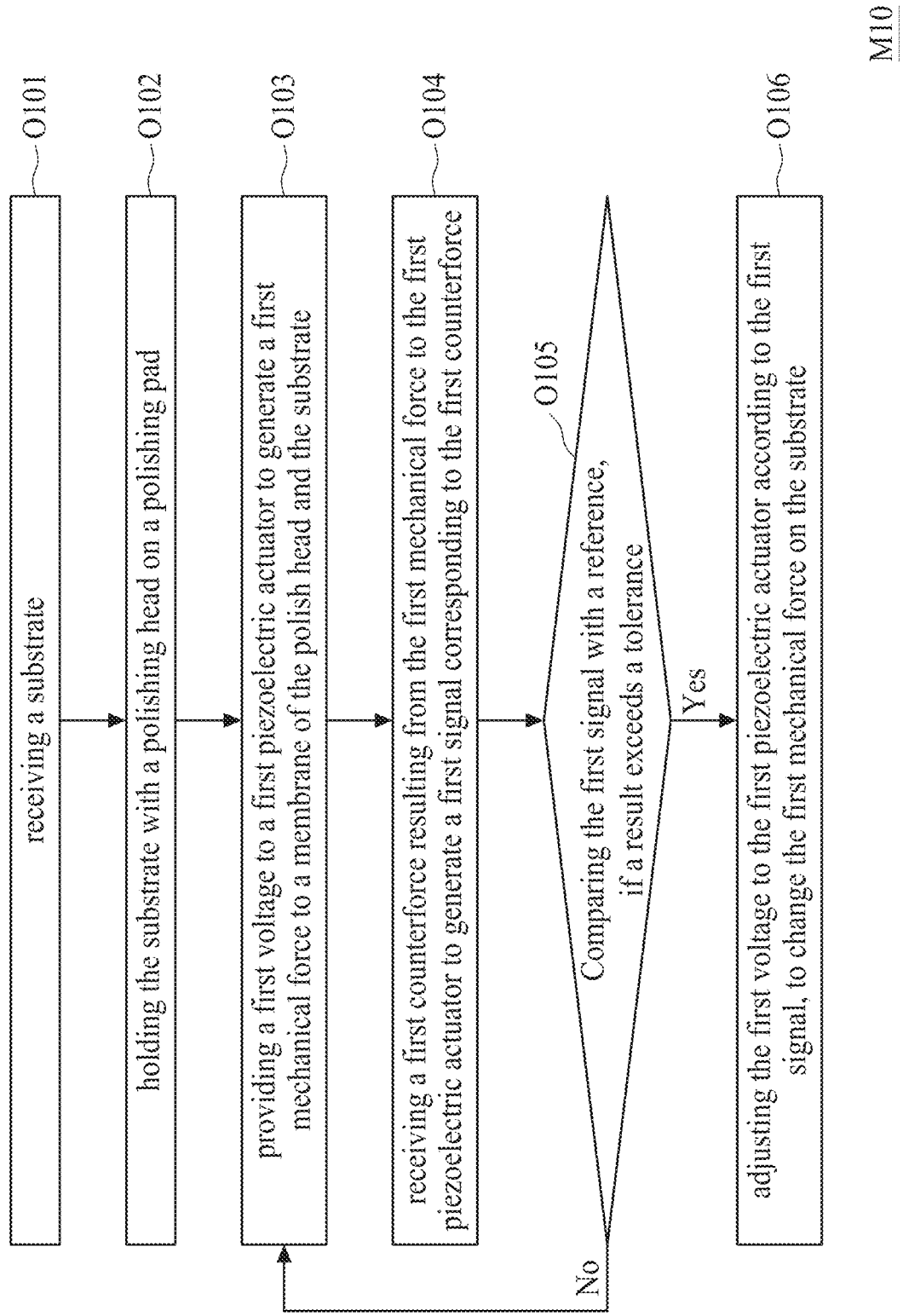
FIG. 8 is a flowchart of a method in accordance with some embodiments of the present disclosure.

FIG. 8 is a flowchart of the method M10 in accordance with some embodiments of the present disclosure. The method M10 includes several operations O101, O102, O103, O104, O105, and O106. In the operation O101, the substrate SB is received by or provided to the CMP system 10, and the polishing pad 201 is disposed on the platen 200. In the operation O102, the substrate SB is held by the polishing head 100 on the polishing pad 201. In order to push the substrate SB against the polishing pad 201, one or more voltages are provided to the plurality of piezoelectric actuators 120. In some embodiments, different voltages are provided to different groups of the piezoelectric actuators 120. In some embodiments, voltages are provided individually to the respective piezoelectric actuators 120.

Figure 9:
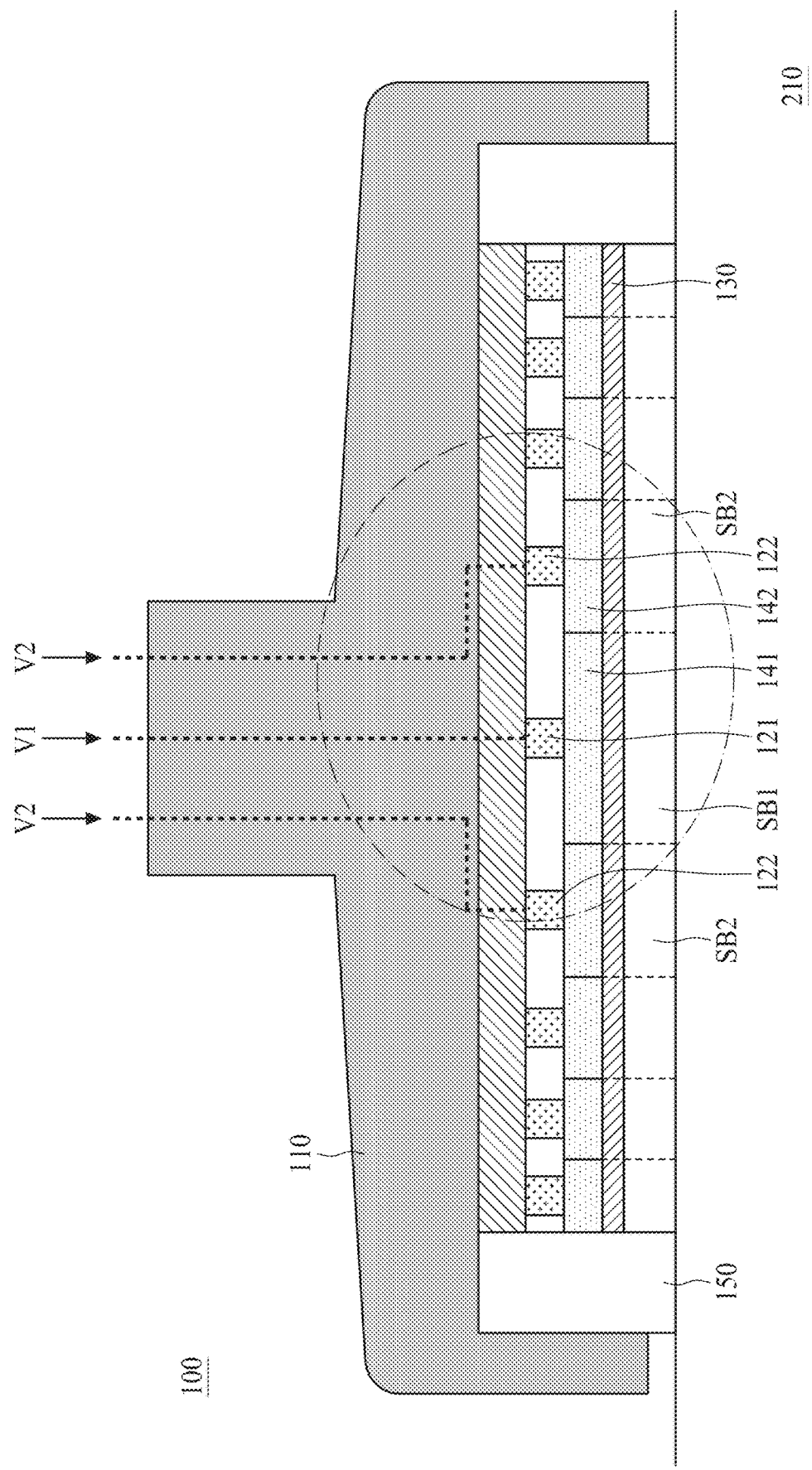
FIG. 9 is a schematic diagram of a polishing head holding a substrate on a polishing pad in accordance with some embodiments of the present disclosure.
Figure 10:
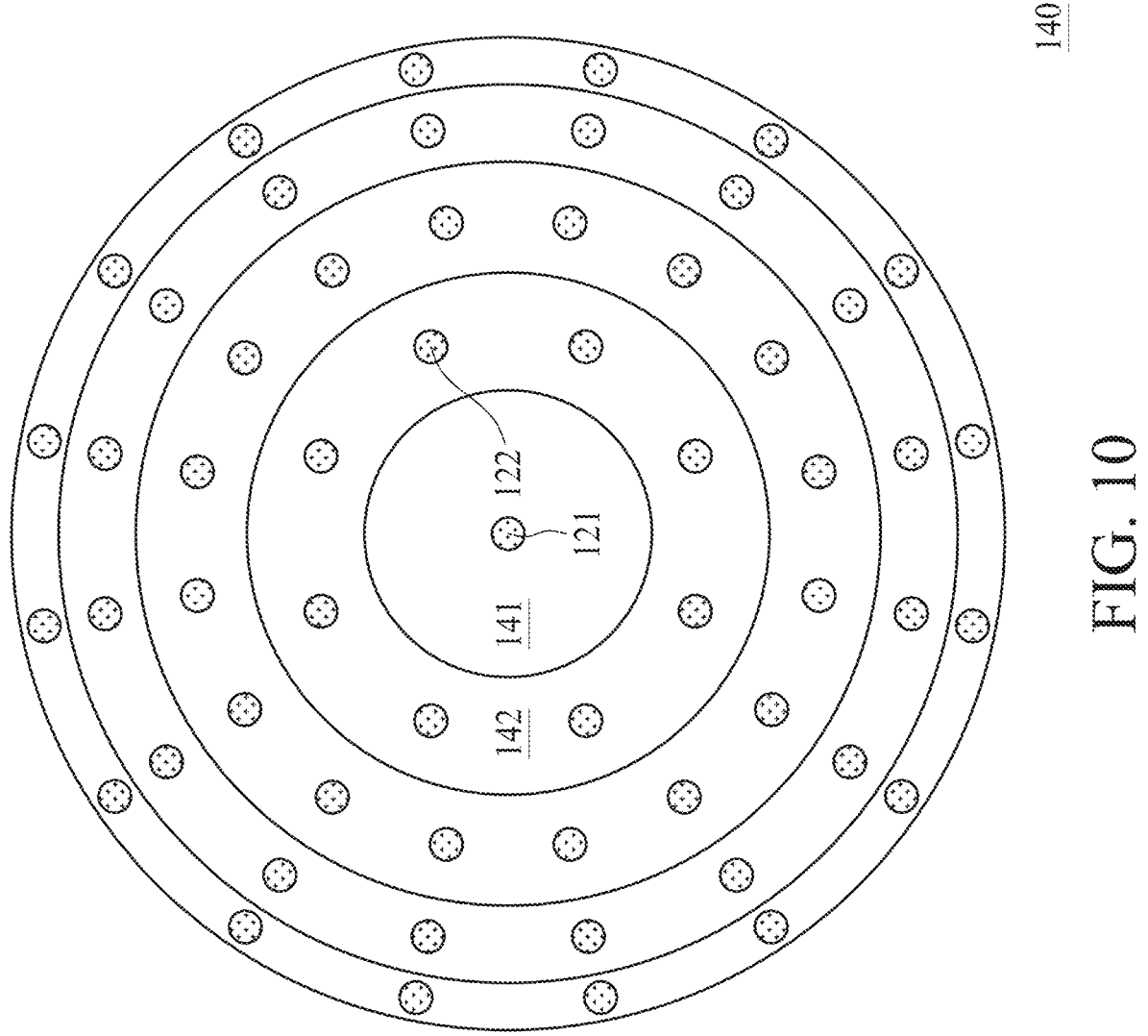
FIG. 10 is a top view perspective showing arrangements of piezoelectric actuators and plates in accordance with some embodiments of the present disclosure.
Figure 11:
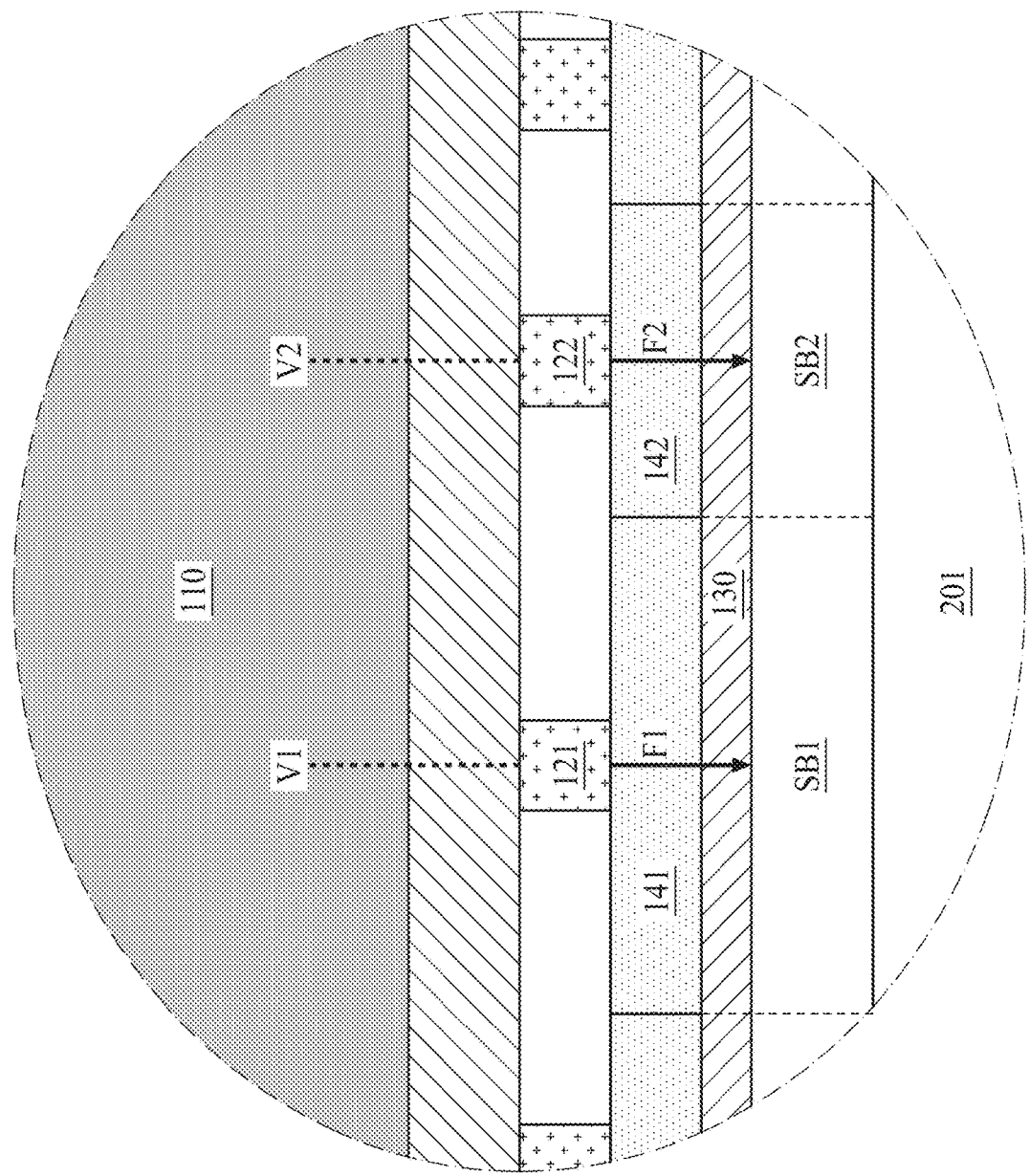
FIGS. 11-12 are enlarged views of the circled portion in FIG. 7 according to different operations of a method in accordance with some embodiments of the present disclosure.

FIG. 9 is a schematic diagram of the polishing head 100 holding the substrate SB on the polishing pad 201 in accordance with some embodiments, and FIG. 10 is a top view perspective showing arrangements of the plurality of piezoelectric actuators 120 and the plurality of plates 140 of the polishing head 100 shown in FIG. 9. FIG. 11 is an enlarged view of the circled portion in FIG. 9 illustrating the operation O103 of the method M10. The polishing head 100 in FIG. 9 being similar to the polishing head 100 in FIG. 2 is used in the following description to illustrate the method M10 for a purpose of illustration but it is not intended to limit the present disclosure. In other embodiments, the plate 140 shown in FIG. 5 or 6 can be used. The arrangement of the piezoelectric actuators 120 and the plates 140 in FIG. 10 is similar to the arrangement in FIG. 4, but all the piezoelectric actuators 120 have the same size and shape. In addition, for a purpose of illustration, in FIGS. 10-11, only the plates 141 and 142, respective piezoelectric actuators 120 and respective regions SB1 and SB2 of the substrate SB are labelled and described in the following illustration, but are not intended to limit the present disclosure.

The plates 141 and 142 overlap different regions SB1 and SB2 of the substrate SB as indicated by dashed lines in FIG. 9, and thus, mechanical forces applied to the regions SB1 and SB2 of the substrate SB are controlled by the respective piezoelectric actuators 120. As shown in FIGS. 10-11, an actuator 121 of the piezoelectric actuators 120 is connected to the plate 141, and a first voltage V1 is provided to the actuator 121 to generate a mechanical force F1 to the membrane 130 and the region SB1 of the substrate SB. Since the plate 141 is made of a hard material, the mechanical force F1 is evenly applied to the region SB1 of the substrate SB through the membrane 130. Similarly, a second voltage V2 is provided to one or more actuators 122 of the piezoelectric actuators 120 adjacent to the actuator 121 to generate a second mechanical force F2 on the membrane 130 and the region SB2 of the substrate SB. In the embodiments having multiple actuators 122 connected to the plate 142, one or more second voltages are applied to all the actuators 122 so that the mechanical force F2 can be evenly applied to the region SB2 of the substrate SB.

Figure 12:
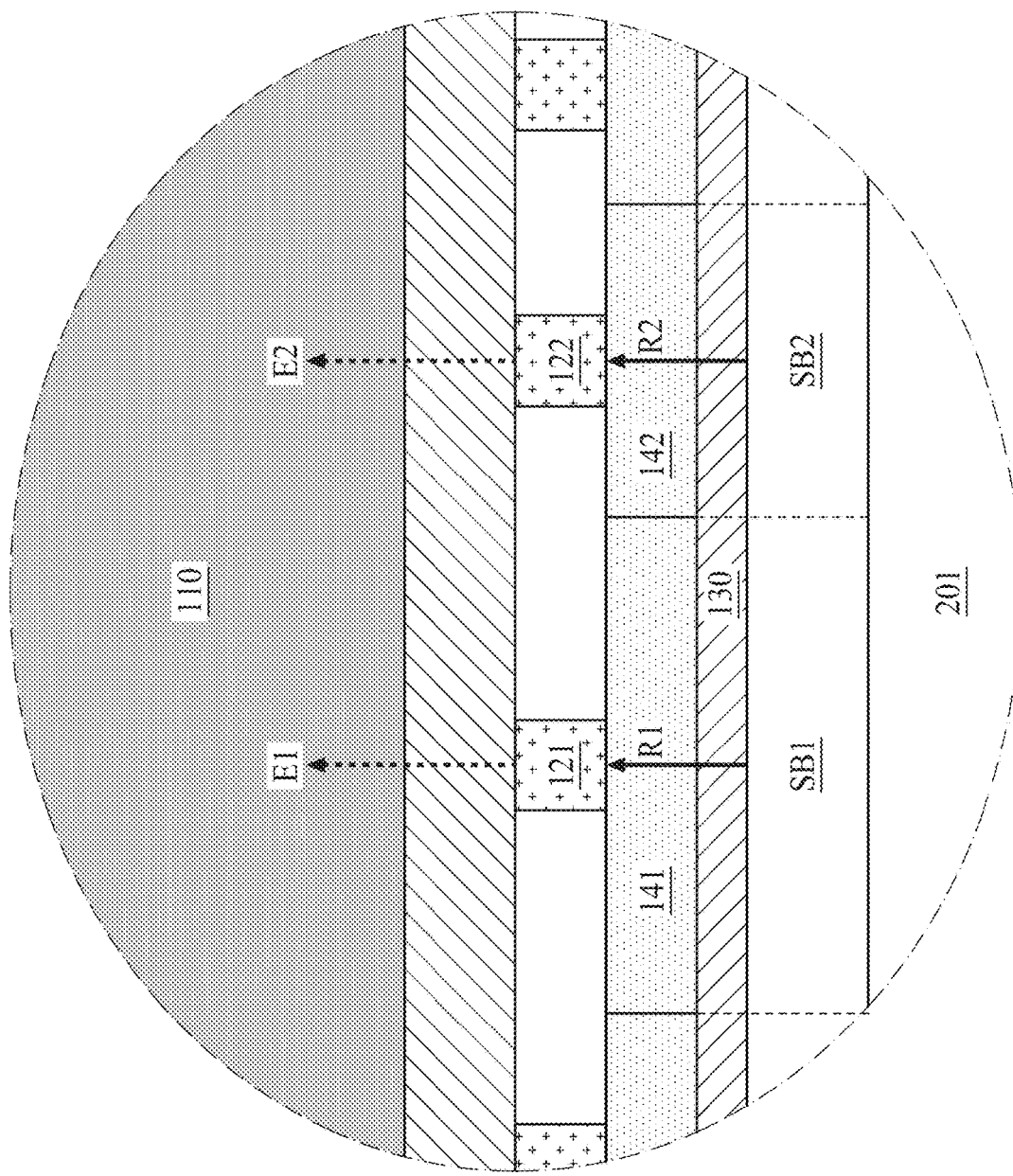

FIG. 12 is an enlarged view of the circled portion in FIG. 10 illustrating the operation O104 of the method M10. After the substrate SB receives the mechanical forces from the piezoelectric actuators 120, counterforces with respect to the mechanical forces are generated. As shown in FIG. 12, a counterforce R1 resulting from the mechanical force F1 is generated, and the counterforce R1 is received by the actuator 121. The actuator 121 generates an electrical charge E1 due to the properties and characteristics of a piezoelectric actuator. Similarly, a counterforce R2 resulting from the mechanical force F2 is generated, and the counterforce R2 is received by the actuator 122. The actuator 122 then generates electrical charges E2. The electrical charges E1 and E2 are based on the counterforces R1 and R2, and reflect actual downward forces pushing the regions SB1 and SB2 of the substrate SB against the polishing pad 201 during the CMP operation.

Figure 13:
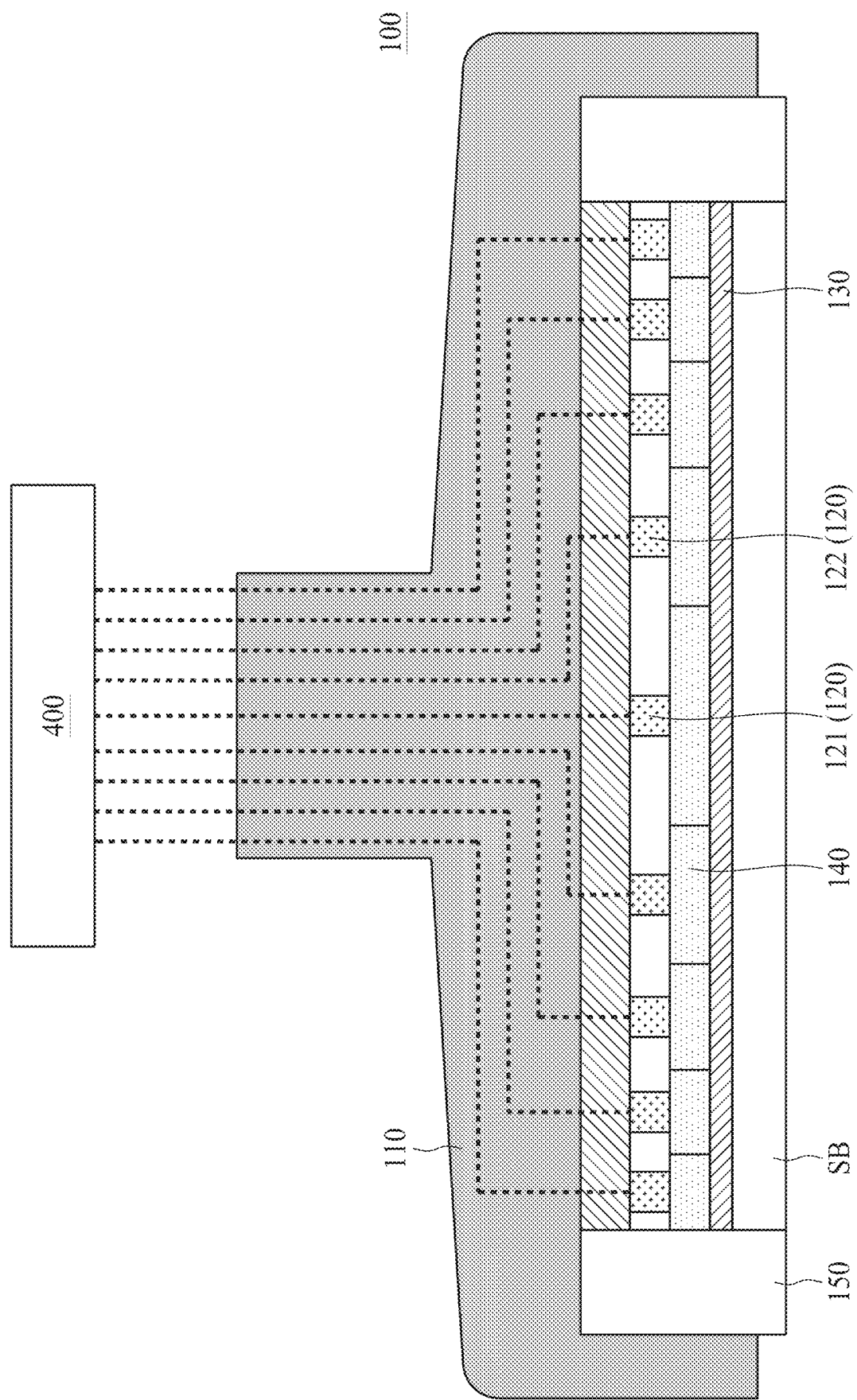
FIG. 13 is a schematic diagram showing electrical connections between a control unit and a plurality of piezoelectric actuators in accordance with some embodiments of the present disclosure.

FIG. 13 is a schematic diagram showing electrical connections between the control unit 400 and the plurality of piezoelectric actuators 120 of the polishing head 100 in FIG. 10. In some embodiments, as shown in FIG. 13, the plurality of piezoelectric actuators 120 is electrically connected to the control unit 400. In accordance with some embodiments and the operations O105 and O106 of the method M10, the electrical charges E1 and E2 are detected, and signals correspond to the electrical charges E1 and E2 are generated and received by the control unit 400. A judgment operation as illustrated in the operation O105 is performed to compare the signals respectively corresponding to the electrical charges E1 and E2. As shown in FIG. 8, the first signal can be one of the signals corresponding to the electrical charges E1 and E2, and the reference can be another one of the signals or a default data, and it is not limited herein. The first signal and/or the reference can be one or more of the signals corresponding to different piezoelectric actuators 120 or different groups of the piezoelectric actuators 120.

In some embodiments, the actuators 122 connected to the plate 142 are electrically connected together to generate one electrical charge E2. In some embodiments, the actuators 122 connected to the plate 142 are individually connected to the voltage V2 and generate multiple electrical charges E2 respective to each of the actuators 122. Such configuration can be adjusted according to different embodiments in order to provide precise control of polish profiles of different regions of the substrate SB. In some embodiments, the piezoelectric actuators 120 in the same group are electrically connected to provide same voltages so that the piezoelectric actuators 120 in the same group can generate same mechanical forces. In some embodiments, the piezoelectric actuators 120 in different groups are electrically isolated. In some embodiments, all the piezoelectric actuators 120 are electrically isolated and can be controlled individually to have a higher flexibility of control of mechanical forces.

In some embodiments, the mechanical forces F1 and F2 generated by the actuators 121 and 122 are different. However, the pressure in the regions SB1 and SB2 of the substrate SB may be substantially equal per unit area. In other words, an average pressure in the region SB2 resulting from the mechanical force F2 should be substantially the same as an average pressure in the region SB1 resulting from the mechanical force F1. The polishing head 100 including the plurality of plates 140 respectively connected to different groups of the plurality of piezoelectric actuators 120 but separated from each other can provide individual control to different regions of the substrate SB without interference of uncontrolled pressure from adjacent air cells as in the conventional CMP device. The different regions with different distances to the center of the substrate SB can therefore have uniform polish uniformity. In addition, the CMP system 10 can instantly adjust the voltage provided to an individual plate 140 or individual piezoelectric actuator 120, and thus a good polish profile of the substrate SB can be provided.

Therefore, in some embodiments and in accordance with the operation O105, if the average pressures in the regions SB1 are SB2 different and the result of the comparison between the two corresponding signals exceeds the tolerance, one or more of the voltages V1 and V2 are adjusted by the control unit 400 in order to adjust the respective mechanical forces F1 and F2. The tolerance can be an experimental or theoretical data depending on different applications, and it is not limited herein. On the other hand, if the average pressures in the regions SB1 are SB2 are determined to be substantially equal according to the result of the comparison, the method M10 proceed to perform the operation O103, and no adjustment to the voltage V1 and/or the voltage V2 is required.

Concepts and purposes of the present disclosure are as illustrated using the polishing head 100, but the present disclosure is not limited herein. In the embodiments illustrated above, the piezoelectric actuators 120 individually cannot entirely cover the respective regions of the substrate SB, and the plurality of plates 140 function to evenly apply the mechanical forces from the piezoelectric actuators 120 to the substrate SB. It should be noted that, in some embodiments, the plates 140 having separated sectors as shown in FIG. 6 is used, and regions of the substrate SB corresponding to the gaps between adjacent sectors may be negligible. Even there are some regions of the substrate SB may not directly covered by the sectors, the distances D1 and D2 between adjacent sectors and plates are controlled. In addition, the member 130 is a monolithic and flexible structure, and the regions of the substrate SB corresponding to the gaps can still receive indirect mechanical forces. Therefore, a good polish uniformity of the substrate SB can be provided.

In some embodiments of the present disclosure, the piezoelectric actuators 120 are collectively arranged to form a circular shape matching the shape of the substrate SB in order to entirely cover the substrate SB. Thus, the piezoelectric actuators 120 can also function as the plurality of plates 140.

Figure 14:
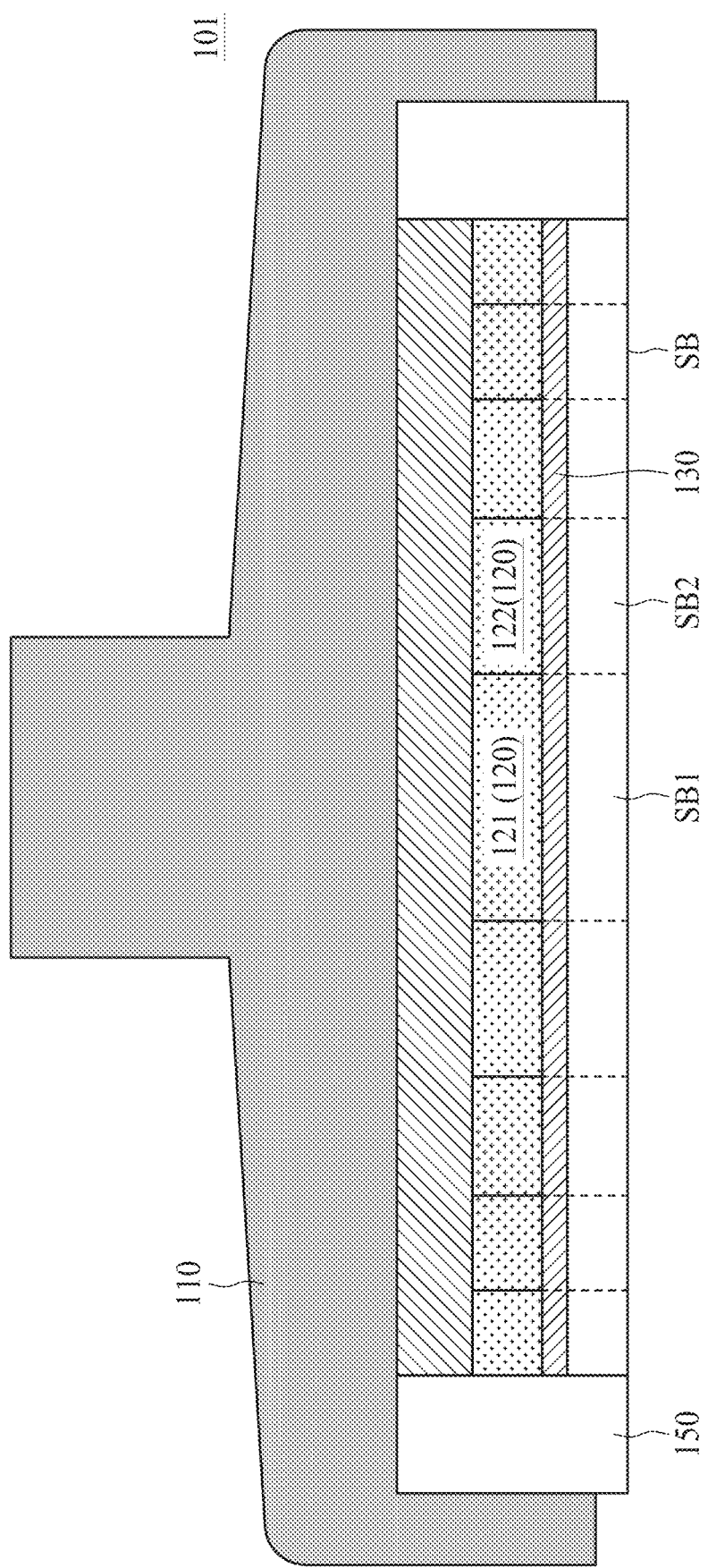
FIG. 14 shows a schematic diagram of a polishing head in accordance with some embodiments of the present disclosure.

FIG. 14 shows a schematic diagram of a polishing head 101 in accordance with some embodiments of the present disclosure. The polishing head 101 is similar to the polishing head 100 but without the plurality of plates 140 and with different configurations of the piezoelectric actuators 120. As shown in FIG. 14, the plurality of piezoelectric actuators 120 is in contact with the membrane 130. In order to have a good polish profile of the substrate SB, a number of actuators of the plurality of piezoelectric actuators 120 and their configurations can be adjusted according to different embodiments. It should be noted that, a piezoelectric actuator 120 can be in contact with or separated from an adjacent piezoelectric actuator 120. A distance between two adjacent piezoelectric actuators 120 can be also in a range of zero and 0.02 millimeters (mm).

Figure 15:
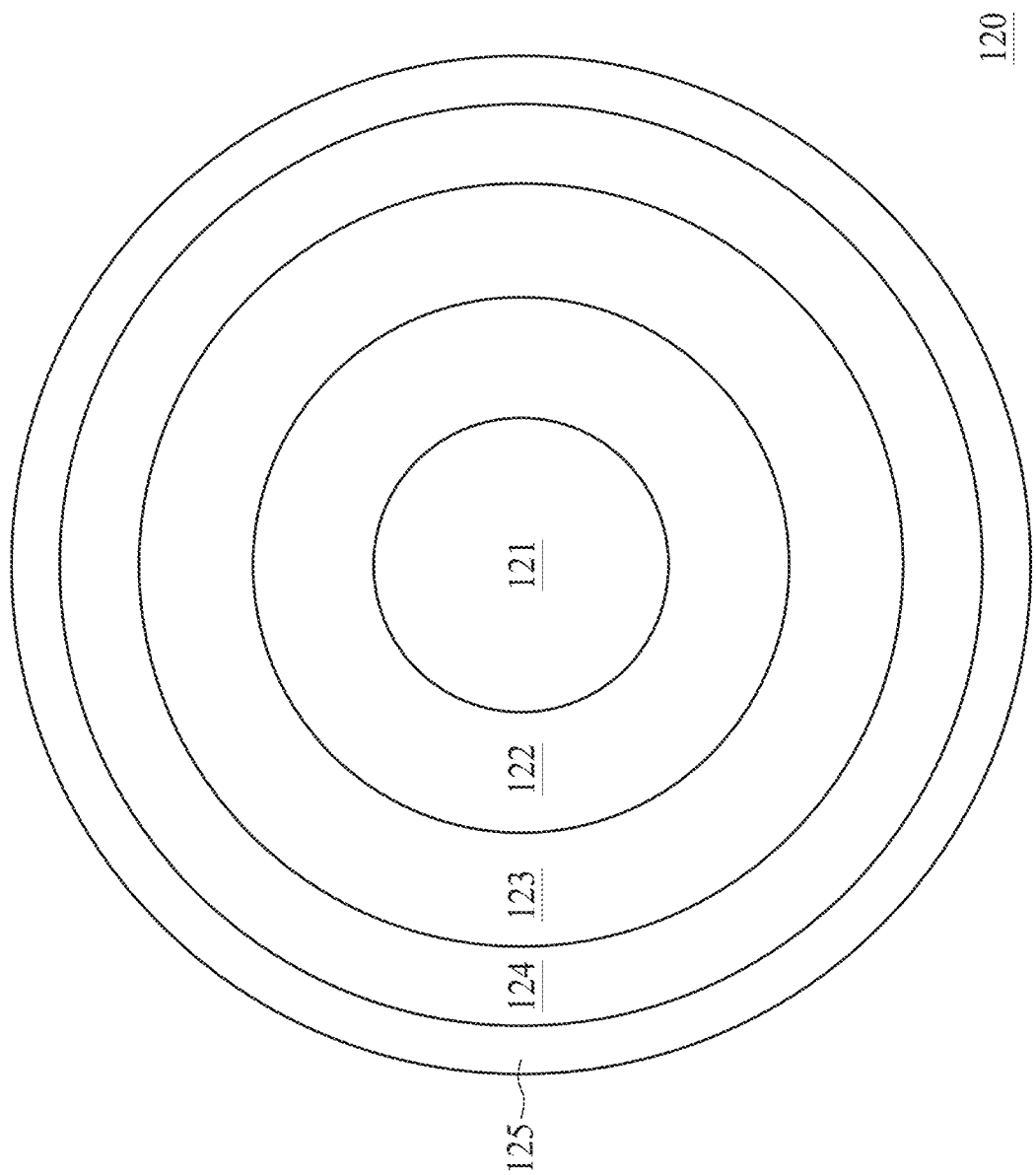
FIGS. 15-16 are top view perspectives of a plurality of piezoelectric actuators in accordance with some embodiments of the present disclosure.

FIG. 15 is a top view perspective of the plurality of piezoelectric actuators 120 shown in FIG. 14 according to some embodiments of the present disclosure. In the embodiments, the plurality of piezoelectric actuators 120 includes an actuator 121 having a circular shape and disposed at a center (or a center of rotation) of the plurality of piezoelectric actuators 120 corresponding to a central region (e.g., region SB1) of the substrate SB. The plurality of piezoelectric actuators 120 also includes an actuator 122 having a ring shape and surrounding the actuator 121. The actuator 122 overlaps a region SB2 surrounding the region SB1 of the substrate SB. The plurality of piezoelectric actuators 120 further includes an actuator 123 surrounding the actuator 122, an actuator 124 surrounding the actuator 123, and an actuator 125 surrounding the actuator 124. Configuration and arrangement of the plurality of piezoelectric actuators 120 from the top view perspective are similar to the configuration and arrangement of the plurality of plates 140 as shown in FIG. 3, and repeated description is omitted herein. The piezoelectric actuators 120 include hard materials and are able to evenly provide mechanical forces to the respective regions of the substrate SB without the plurality of plates 140 disposed therebetween.

Figure 16:
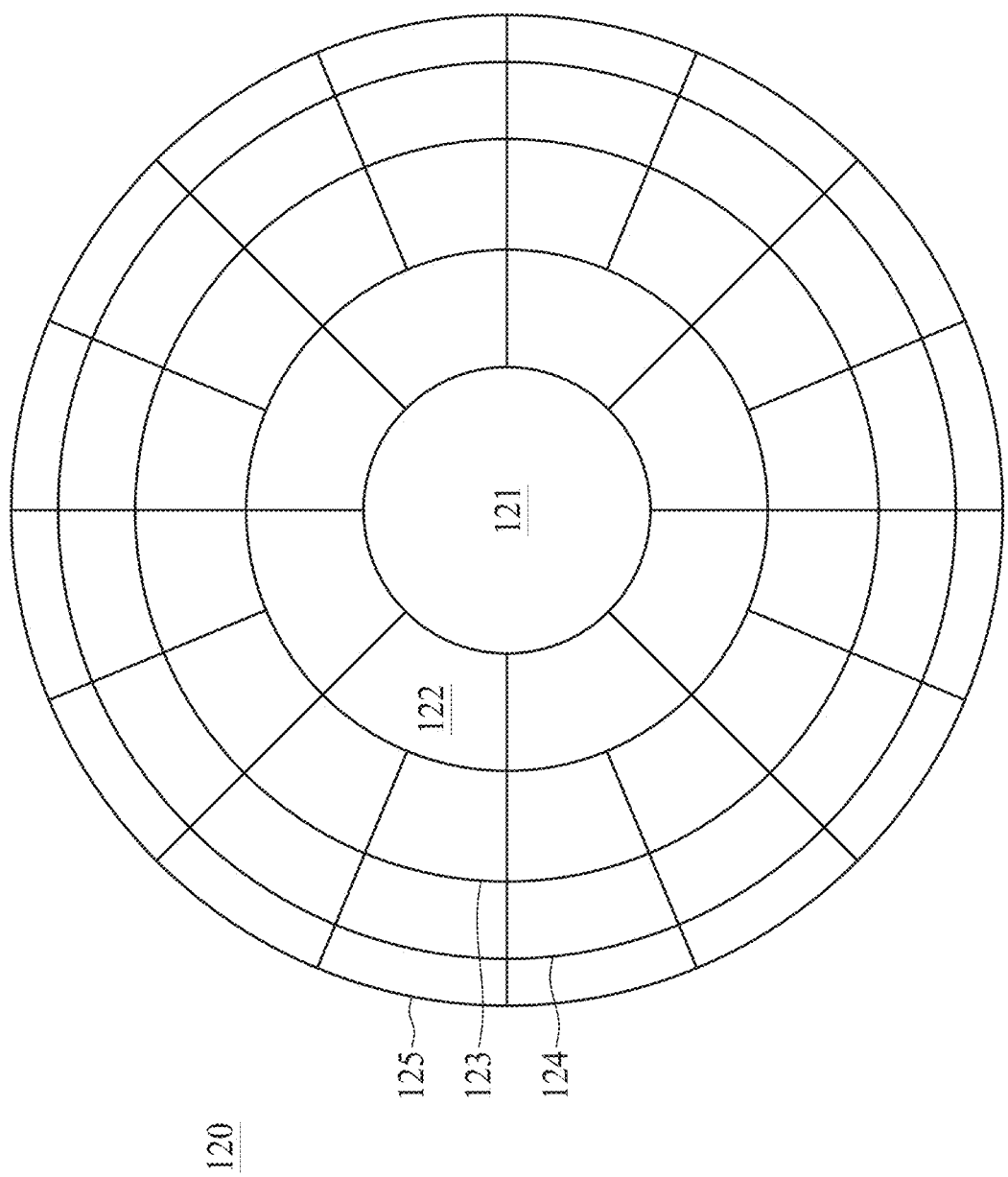

In some embodiments, one or more of the plurality of piezoelectric actuators 120 include several sectors. FIG. 16 is a top view perspective of the plurality of piezoelectric actuators 120 as shown in FIG. 14 according to some embodiments of the present disclosure. The sectors in a single actuator 122, 123, 124 or 125 are adjacent to one another and are arranged to form the ring shape of the respective actuator 122, 123, 124 or 125. Each sector of the actuator 122, 123, 124 or 125 can be individually connected to different voltage sources, and thus different sectors corresponding to different regions of the substrate SB can be individually adjusted to allow precise control of the polish profile of the substrate SB. Configuration and arrangement of the sectors of the plurality of piezoelectric actuators 120 are similar to the plurality of plates 140 as shown in FIG. 5, and repeated description is omitted herein. In addition, it is noted that only the structure of the polishing head 101 is illustrated herein for a purpose of illustration, and the polishing head 101 can also applied in the system 10 and the method M10.

Some embodiments of the present disclosure provide a wafer polishing head. The wafer polishing head includes a carrier head, a plurality of piezoelectric actuators disposed on the carrier head, and a membrane disposed over the plurality of piezoelectric actuators. The plurality of piezoelectric actuators is configured to provide mechanical forces on the membrane and generate an electrical charge when receiving counterforces of the mechanical forces through the membrane.

Some embodiments of the present disclosure provide a wafer polishing system. The system includes a platen, a polishing head, and a control unit. The platen is configured to allow a polishing pad to be disposed thereon. The polishing head is configured to hold a substrate against the polishing pad, and includes a plurality of piezoelectric actuators and a membrane. The plurality of piezoelectric actuators is connected to one or more voltages. The membrane is disposed between the plurality of piezoelectric actuators and the substrate. The control unit is electrically connected to the plurality of piezoelectric actuators, and configured to receive a signal of an electrical charge generated by the plurality of piezoelectric actuators.

Some embodiments of the present disclosure provide a method for polishing a substrate. The method includes several operations. A substrate is received, and is held by a polishing head on a polishing pad. The polishing head includes a carrier head, a first piezoelectric actuator and a membrane. The first piezoelectric actuator is disposed on the carrier head and configured to provide a first mechanical force on the substrate against the polishing pad, and the membrane is disposed between the substrate and the first piezoelectric actuator. A first voltage is provided to the first piezoelectric actuator to generate the first mechanical force to the membrane and the substrate. A first counterforce resulting from the first mechanical force is received by the first piezoelectric actuator, and a first signal corresponding to the first counterforce is generated by the first piezoelectric actuator. The first signal is compared with a reference, and the first voltage to the first piezoelectric actuator is adjusted according to the first signal in order to change the first mechanical force on the substrate if a result of the comparison between the first signal and the reference exceeds a tolerance.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer polishing head, comprising:
    a carrier head;
    a plurality of piezoelectric actuators, disposed on the carrier head;
    a membrane, disposed over the plurality of piezoelectric actuators, wherein the plurality of piezoelectric actuators is configured to provide mechanical forces on the membrane and generate electrical charges when receiving counterforces of the mechanical forces through the membrane; and
    a plurality of plates, disposed between the membrane and the plurality of piezoelectric actuators.

2. The wafer polishing head of claim 1, wherein a distance between two adjacent plates of the plurality of plates is in a range of 0 to 0.02 millimeters.

3. The wafer polishing head of claim 1, wherein the plurality of plates comprise a first plate having a circular shape and at least a second plate having a ring shape and surrounding the first plate.

4. The wafer polishing head of claim 3, wherein the second plate includes a plurality of sectors, being adjacent to one another and arranged to form the ring shape.

5. The wafer polishing head of claim 4, wherein each of the sectors is connected to one of the plurality of piezoelectric actuators.

6. The wafer polishing head of claim 3, wherein the second plate is a monolithic structure and connected to several of the plurality of piezoelectric actuators.

7. The wafer polishing head of claim 3, wherein the first plate is connected to one of the plurality of piezoelectric actuators.

8. The wafer polishing head of claim 1, wherein the plurality of piezoelectric actuators is in contact with the membrane.

9. The wafer polishing head of claim 8, wherein the plurality of piezoelectric actuators comprise a first actuator having a circular shape and at least a second actuator having a ring shape and surrounding the first actuator.

10. The wafer polishing head of claim 9, wherein the second actuator includes a plurality of sectors, being adjacent to one another and arranged to form the ring shape.

11. A wafer polishing system, comprising:
    a platen, configured to allow a polishing pad to be disposed thereon;
    a polishing head, configured to hold a substrate against the polishing pad, the polishing head comprising:
        a plurality of piezoelectric actuators, connected to one or more voltages; and
        a membrane, disposed between the plurality of piezoelectric actuators and the substrate; and
    a control unit, electrically connected to the plurality of piezoelectric actuators, and configured to receive a signal of an electrical charge generated by the plurality of piezoelectric actuators wherein the plurality of piezoelectric actuators are grouped into a plurality of groups, and the piezoelectric actuators in one group are all connected to a single voltage and have a substantially same distance to a center of the membrane.

12. The wafer polishing system of claim 11, wherein the one or more voltages are adjusted by the control unit according to the signal of the electrical charge generated by the plurality of piezoelectric actuators.

13. The wafer polishing system of claim 11, wherein all of the plurality of piezoelectric actuators are electrically isolated from one another.

14. The wafer polishing system of claim 11, wherein one or more of piezoelectric actuators of one of the plurality of groups define a ring shape, and different groups of the plurality of groups define multiple concentric ring shapes.

15. The wafer polishing system of claim 11, further comprising:
    a slurry delivery unit, configured to apply a slurry onto the polishing pad.

16. A method for polishing a substrate, comprising:
    receiving a substrate;
    holding the substrate with a polishing head on a polishing pad, wherein the polishing head comprises:
        a carrier head;
        a first piezoelectric actuator, disposed on the carrier head and configured to provide a first mechanical force on the substrate against the polishing pad;
        a second piezoelectric actuator adjacent to the first piezoelectric actuator, wherein the first piezoelectric actuator and the second piezoelectric actuator overlap different regions of the substrate; and
        a membrane, disposed between the substrate and the first piezoelectric actuator and between the substrate and the second piezoelectric actuator;
    providing a first voltage to the first piezoelectric actuator to generate the first mechanical force to the membrane and the substrate;
    receiving a first counterforce resulting from the first mechanical force to the first piezoelectric actuator to generate a first signal corresponding to the first counterforce;
    comparing the first signal with a reference; and
    adjusting the first voltage to the first piezoelectric actuator according to the first signal.

17. The method of claim 16, wherein the first voltage is adjusted by a control unit, electrically connecting to the first piezoelectric actuator.

18. The method of claim 16, wherein the first mechanical force on the substrate is changed by the adjustment of the first voltage if a result of the comparison between the first signal and the reference exceeds a tolerance.

19. The method of claim 18, wherein a second voltage is provided to the second piezoelectric actuator to generate a second mechanical force on the substrate and the second mechanical force is different from the first mechanical force.

20. The method of claim 18, further comprising:
    providing a second voltage to the second piezoelectric actuator to generate a second mechanical force on the substrate in the second region; and
    receiving a second counterforce resulting from the second mechanical force to the second piezoelectric actuator to generate a second signal corresponding to the second counterforce, wherein the second signal is compared with the first signal as the reference.

* * * * *